(12) United States Patent
Romano et al.

(10) Patent No.: US 8,361,564 B2
(45) Date of Patent: Jan. 29, 2013

(54) PROTECTIVE LAYER FOR IMPLANT PHOTORESIST

(75) Inventors: Andrew R. Romano, Pleasanton, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 1075 days.

(21) Appl. No.: 12/339,514

(22) Filed: Dec. 19, 2008

(65) Prior Publication Data

US 2009/0162553 A1 Jun. 25, 2009
US 2012/0328781 A9 Dec. 27, 2012

Related U.S. Application Data

(63) Continuation-in-part of application No. 11/223,363, filed on Sep. 9, 2005, now Pat. No. 7,491,647, which is a continuation-in-part of application No. 11/076,087, filed on Mar. 8, 2005, now Pat. No. 7,241,683.

(60) Provisional application No. 61/016,368, filed on Dec. 21, 2007.

(51) Int. Cl.
*C23C 14/04* (2006.01)
*C23C 14/14* (2006.01)
*C23C 14/00* (2006.01)

(52) U.S. Cl. ......... 427/526; 427/527; 427/523; 438/514

(58) Field of Classification Search .................. 427/526, 427/527, 523; 438/301, 303, 369, 514, 294
See application file for complete search history.

(56) References Cited

U.S. PATENT DOCUMENTS

| 6,103,445 | A | 8/2000 | Willson et al. |
| 6,143,466 | A | 11/2000 | Choi |
| 6,348,384 | B1 | 2/2002 | Lin |
| 7,241,683 | B2 | 7/2007 | Hudson et al. |
| 7,273,815 | B2 | 9/2007 | Sadjadi et al. |
| 2007/0264830 | A1 | 11/2007 | Huang et al. |

FOREIGN PATENT DOCUMENTS

JP 06-151349 A 5/1994

OTHER PUBLICATIONS

International Search Report dated Jul. 21, 2009 from International Application No. PCT/2008/086825.
Written Opinion dated Jul. 21, 2009 from International Application No. PCT/2008/086825.

*Primary Examiner* — Dah-Wei Yuan
*Assistant Examiner* — Nga Leung V Law
(74) *Attorney, Agent, or Firm* — Beyer Law Group LLP

(57) ABSTRACT

A method for implanting a dopant in a substrate is provided. A patterned photoresist mask is formed over the substrate, wherein the patterned photoresist mask has patterned photoresist mask features. A protective layer is deposited on the patterned photoresist mask by performing a cyclical deposition, wherein each cycle, comprises a depositing phase for depositing a deposition layer over surfaces of the patterned mask of photoresist material and a profile shaping phase for providing vertical sidewalls. A dopant is implanted into the substrate using an ion beam. The protective layer and photoresist mask are removed.

15 Claims, 5 Drawing Sheets

PROTECTIVE LAYER FOR IMPLANT PHOTORESIST

CROSS REFERENCE TO RELATED APPLICATIONS

This application claims priority under 35 U.S.C. §119(e) from U.S. Provisional Application No. 61/016,368, entitled "PROTECTIVE LAYER FOR IMPLANT PHOTORESIST," filed Dec. 21, 2007, and is a which is incorporated by reference in its entirety for all purposes. This application is also a Continuation-in-part application of prior-filed U.S. application Ser. No. 11/223,363 filed on Sep. 9, 2005, now U.S. Pat. No. 7,491,647, which is a Continuation-in-part application of prior-filed U.S. application Ser. No. 11/076,087 filed on Mar. 8, 2005, now U.S. Pat. No. 7,241,683.

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle. After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed.

SUMMARY OF THE INVENTION

To achieve the foregoing and in accordance with the purpose of the present invention, a method for implanting a dopant in a substrate is provided. A patterned photoresist mask is formed over the substrate, wherein the patterned photoresist mask has patterned photoresist mask features. A protective layer is deposited on the patterned photoresist mask by performing a cyclical deposition, wherein each cycle, comprises a depositing phase for depositing a deposition layer over surfaces of the patterned mask of photoresist material and a profile shaping phase for providing vertical sidewalls. A dopant is implanted into the substrate using an ion beam. The protective layer and photoresist mask are removed.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Photoresist masks may be used as ion implantation masks for implanting a dopant into a substrate. It has been found that when certain photoresist is exposed to high dose and high energy ion implantation the resist can decompose and form a hard crust, where the polymer may become graphitic in nature, which is difficult to strip. In such a case, harsh chemicals or an oxidizing or aggressive plasma is needed to strip such photoresist, which leads to material loss and impacts transistor performance, by creating material loss ie recessed material with respect to the original substrate surface.

Figure 1:
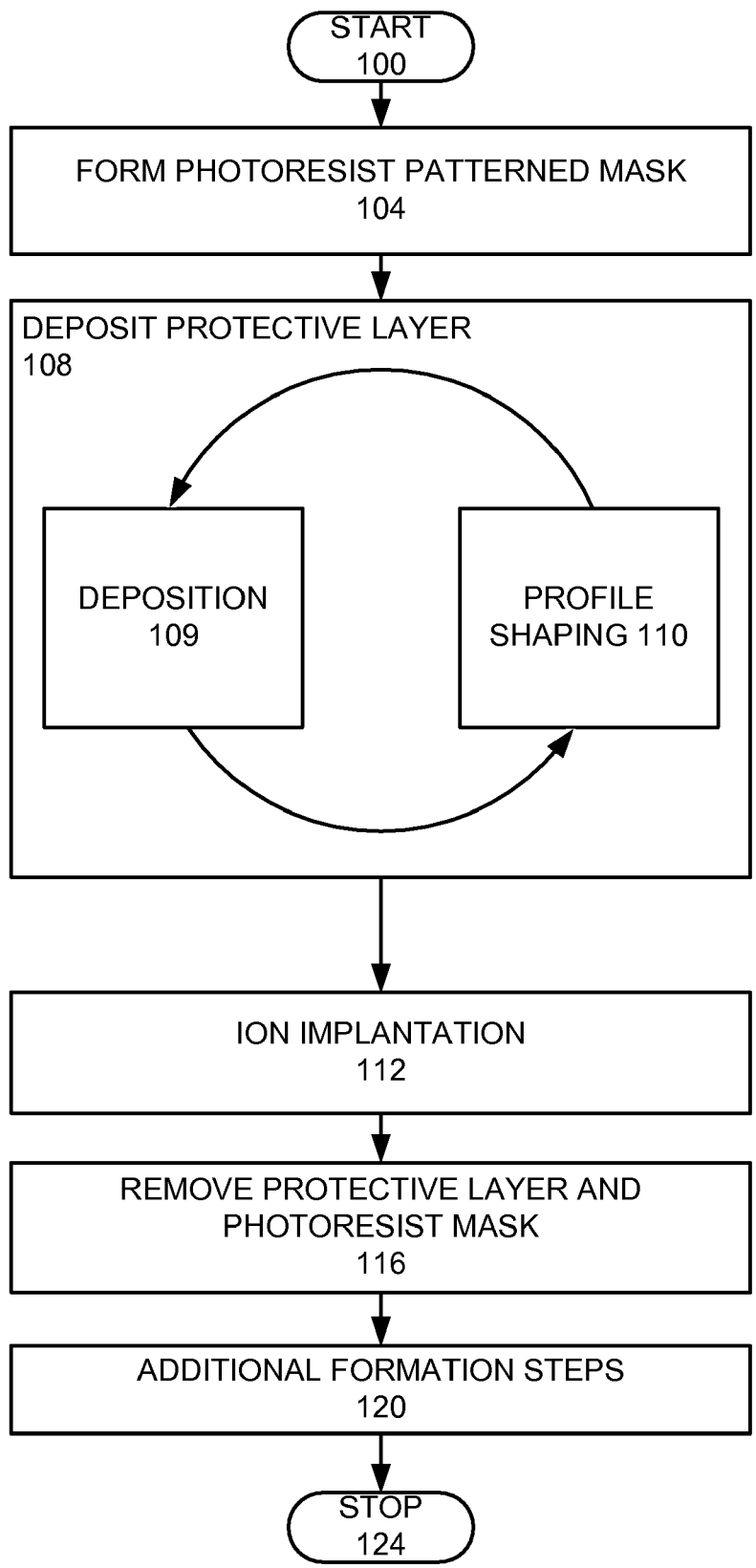
FIG. 1 is a high level flow chart of a process that may be used in an embodiment of the invention.
Figure 2A:
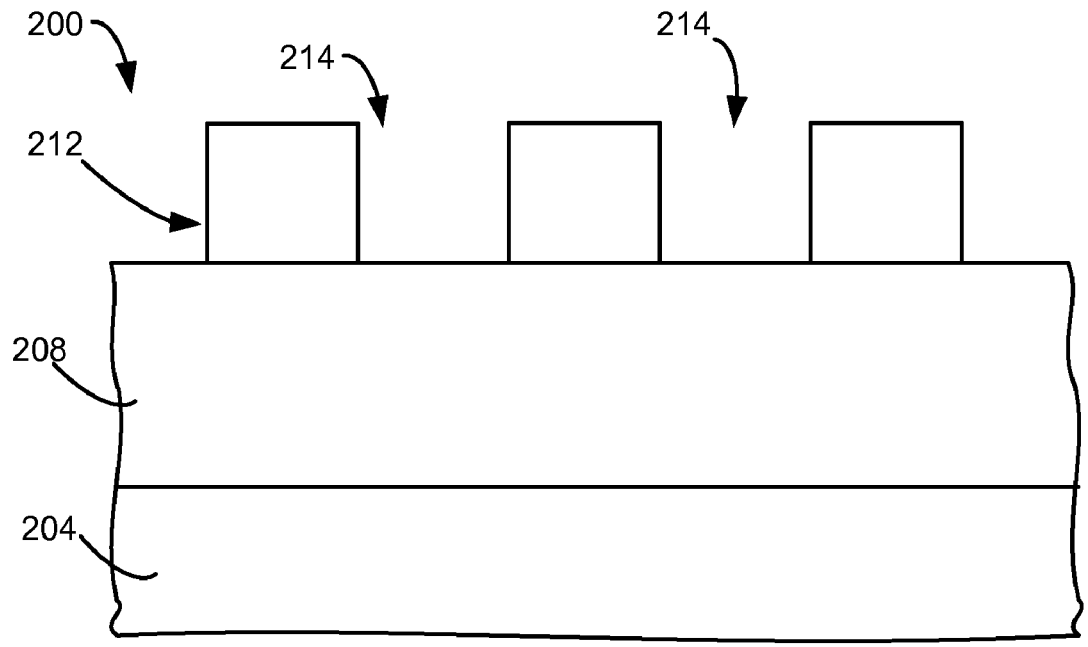
FIGS. 2A-D are schematic cross-sectional views of a stack processed according to an embodiment of the invention.

To facilitate understanding, FIG. 1 is a high level flow chart of a process that may be used in an embodiment of the invention. A photoresist patterned mask is formed over a substrate layer (step 104). FIG. 2A is a schematic cross-sectional view of a substrate layer 208. In this example, the substrate layer 208 is over a wafer 204. In another example the substrate may be the wafer. A patterned photoresist mask 212 with mask features 214 is over the substrate layer 208, which forms a stack 200. An optional BARC or ARL (antireflective layer) may be placed between the substrate and the photoresist mask.

Figure 2B:
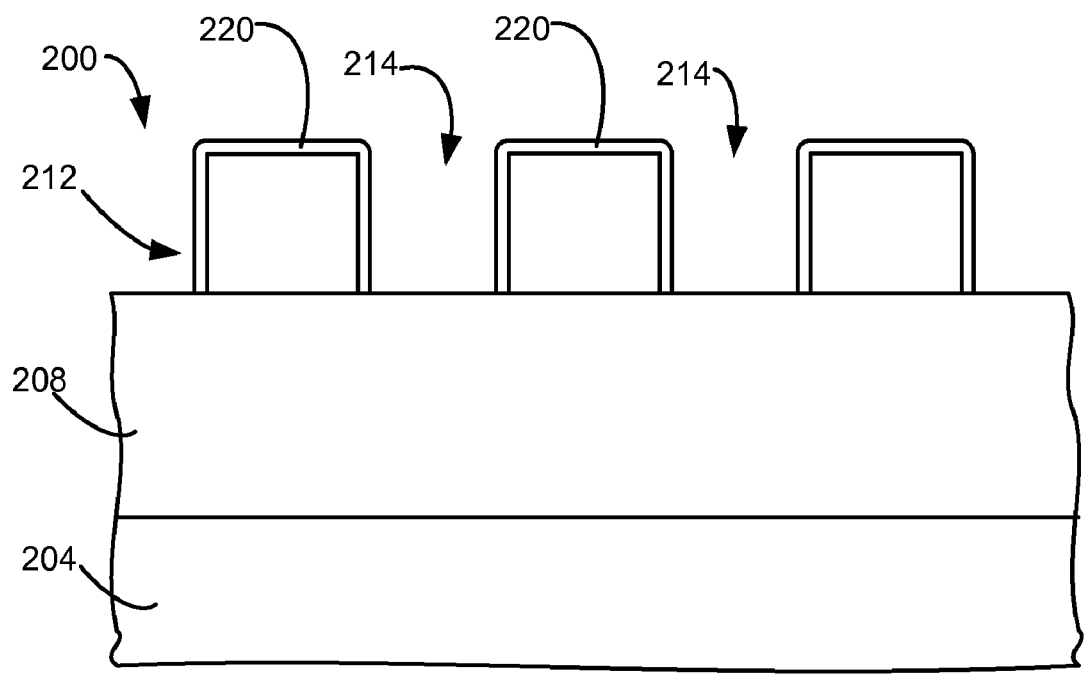

A cyclical formation of a protective layer is performed to form a protective layer on the photoresist mask (step 108). The cyclical protective layer formation process comprises at least two steps of depositing a layer over the sidewalls of the photoresist mask features 214 (step 109) and then shaping the profile of the deposition layer (step 110). FIG. 2B is a schematic cross-sectional view of the patterned photoresist mask 212 with a protective layer 220, formed by the cyclical protective layer formation, deposited over the sidewalls of the feature 214. The deposition layer 220 forms a deposition layer feature 222 within the mask feature 214. In this embodiment, the formation of the protective layer does not form a layer over horizontal substrate layer 208 surface at the bottom of the mask features 214, as shown. Preferably, the protective layer does not form a layer over the horizontal at the bottom of the mask features but is formed on the horizontal surface on top of the photoresist mask.

Figure 2C:
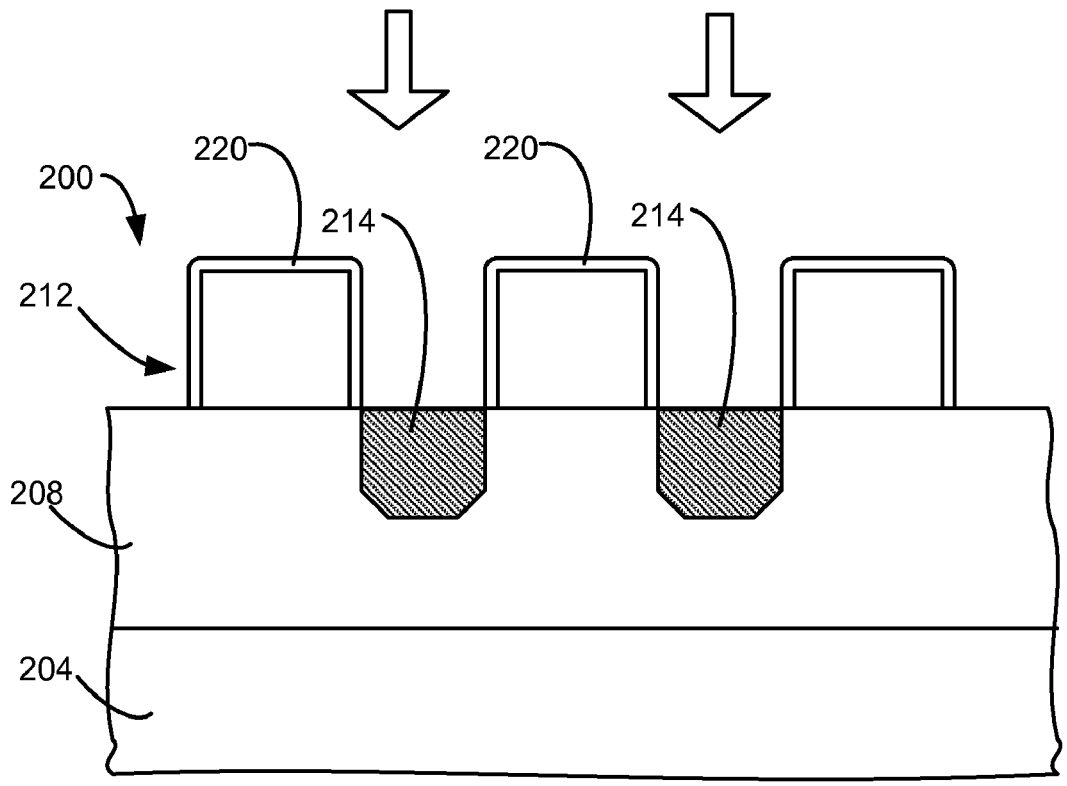
Figure 2D:
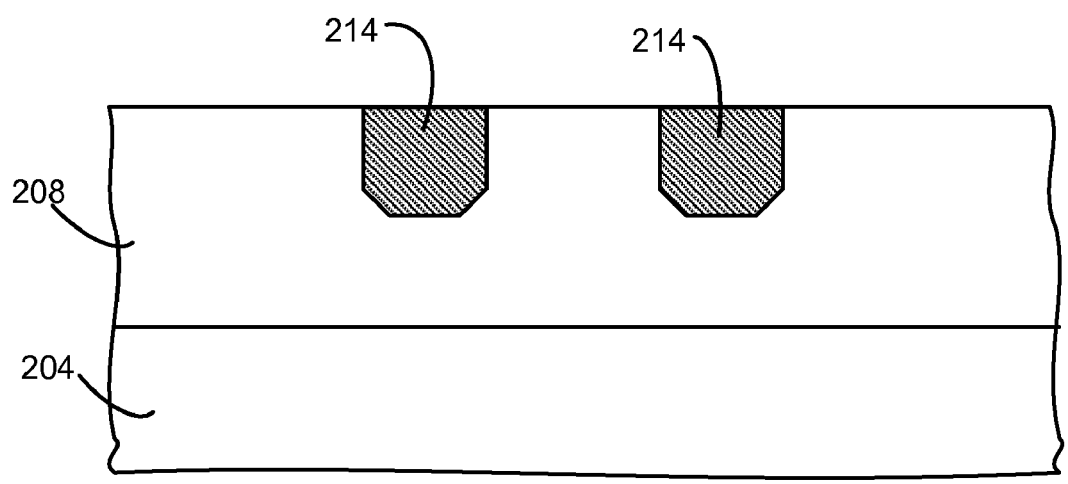

Dopant ions are implanted into the substrate using ion implantation (step 112). FIG. 2C shows dopant regions 214 implanted into the substrate 208. The protective layer and photoresist mask are removed (step 116). This step may simultaneously remove the protective layer and the patterned photoresist mask. In another embodiment, these layers may be removed in individual steps. Because of the protective layer, a conventional photoresist strip process may be used to remove the protective layer and the photoresist mask. FIG. 2D shows the stack 200 after the protective layer and photoresist mask have been removed. Additional formation steps may be performed (step 120). For example, the doped regions may be used to form a transistor.

To facilitate ion implantation, it is preferred that the photoresist has enhanced stopping power for stopping the ions in the ion beam. Generally, photoresist designed for ion implantation (an ion implantation photoresist) would have enhanced stopping power. Without being bound by theory, it is believed that the protective layer will be exposed to higher energy ions. In one example, since the protective layer has shorter chains and less double bonds, and since the protective layer is a deposited polymer, the high energy ions are less likely to cause such polymers to cross-link, and therefore allows the protective layer to be easily removed. Although the photoresist has enhanced stopping power for stopping the ions, after passing through the protective layer, the ions have lower energy and therefore are less likely to cause the photoresist to form graphite or to crosslink.

Example of Implant in Silicon Substrate

In an example of the invention, a layer to be implanted is a silicon layer which is part of the silicon wafer 204. A patterned photoresist mask of 248 nm photoresist is placed over the silicon wafer 204 (step 104). A photoresist mask features are formed in the patterned photoresist mask 212. Presently, for 248 nm photoresist mask a typical CD for the photoresist may be 250-130 nm, using conventional processes. The substrate is placed in a plasma processing chamber.

Figure 3:
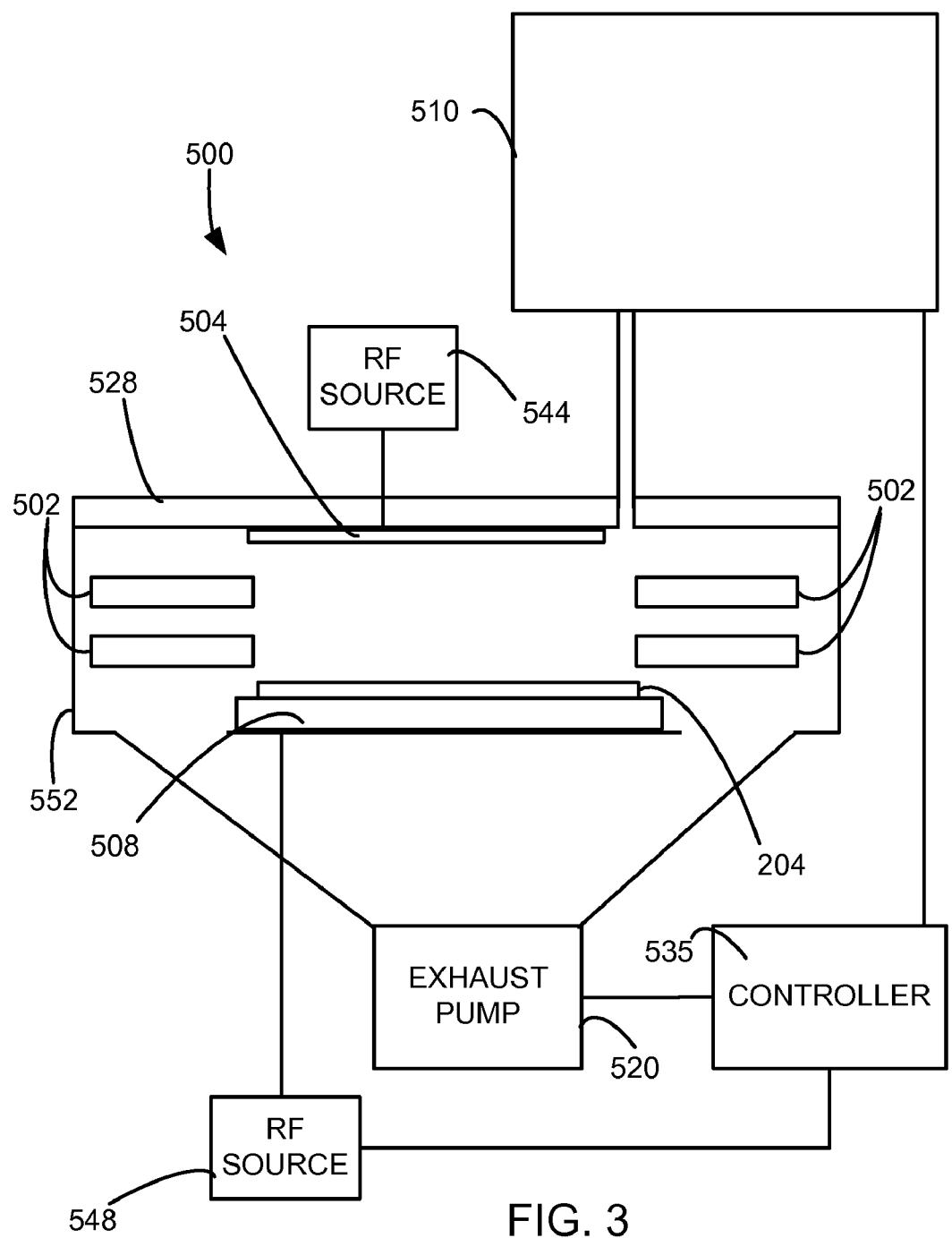
FIG. 3 is a schematic view of a plasma processing chamber that may be used in practicing the invention.

FIG. 3 is a schematic view of a plasma processing chamber 500 that may be used for performing the protective layer formation and stripping. The plasma processing chamber 500 comprises confinement rings 502, an upper electrode 504, a lower electrode 508, a gas source 510, and an exhaust pump 520. Within plasma processing chamber 500, the substrate is positioned upon the lower electrode 508. The lower electrode 508 incorporates a suitable substrate chucking mechanism (e.g., electrostatic, mechanical clamping, or the like) for holding the substrate 204. The reactor top 528 incorporates the upper electrode 504 disposed immediately opposite the lower electrode 508. The upper electrode 504, lower electrode 508, and confinement rings 502 define the confined plasma volume. Gas is supplied to the confined plasma volume by the gas source 510 and is exhausted from the confined plasma volume through the confinement rings 502 and an exhaust port by the exhaust pump 520. A first RF source 544 is electrically connected to the upper electrode 504. A second RF source 548 is electrically connected to the lower electrode 508. Chamber walls 552 surround the confinement rings 502, the upper electrode 504, and the lower electrode 508. Both the first RF source 544 and the second RF source 548 may comprise a 27 MHz power source and a 2 MHz power source. Different combinations of connecting RF power to the electrode are possible. In the case of Exelan HPT™, which is basically the same as an Exelan HP with a Turbo Pump attached to the chamber, made by LAM Research Corporation™ of Fremont, Calif., which may be used in a preferred embodiment of the invention, both the 27 MHz and 2 MHz power sources make up the second RF power source 548 connected to the lower electrode, and the upper electrode is grounded. A controller 535 is controllably connected to the RF sources 544, 548, exhaust pump 520, and the gas source 510.

Figure 4A:
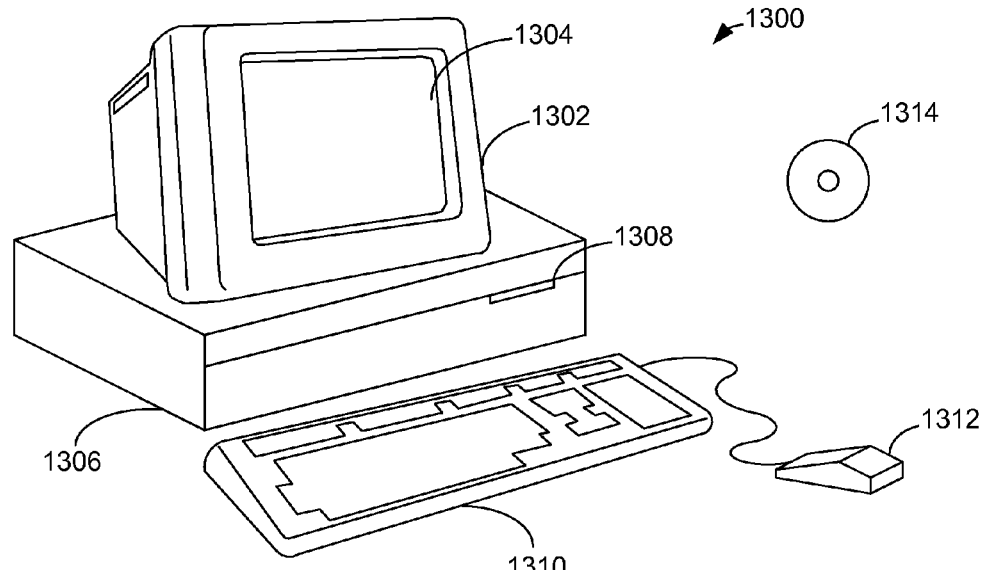
FIGS. 4A-B illustrate a computer system, which is suitable for implementing a controller used in embodiments of the present invention.
Figure 4B:
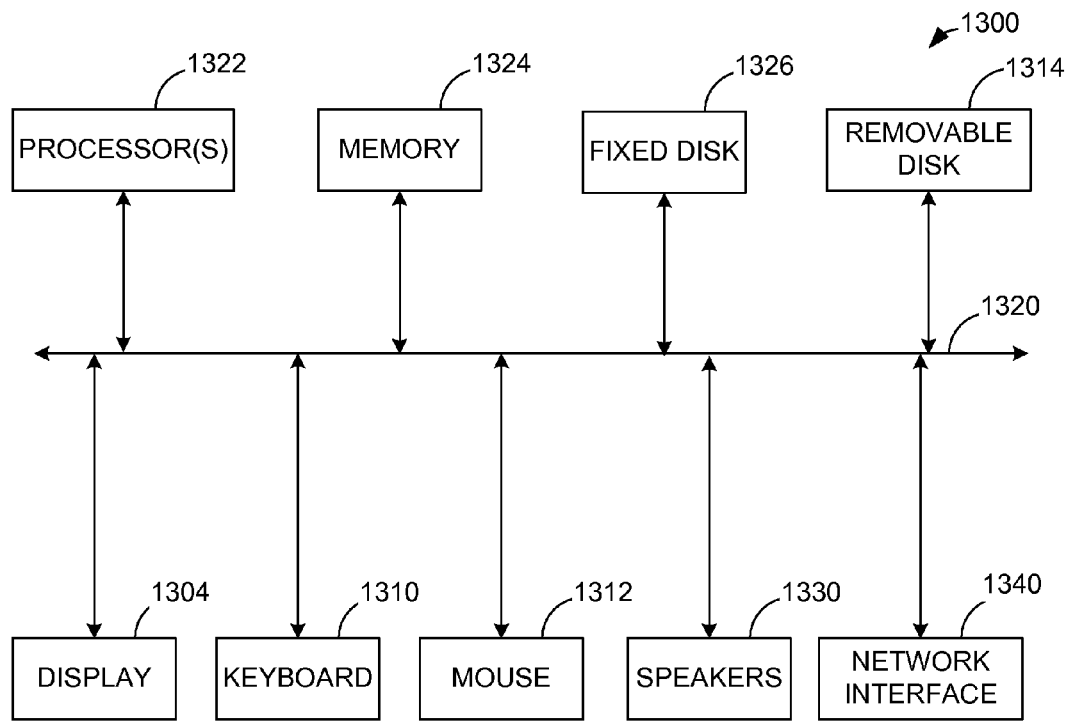

FIGS. 4A and 4B illustrate a computer system 1300, which is suitable for implementing a controller 535 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 4B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312 and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Other examples may use other devices to carry out the invention.

Next, the cyclical formation of the protective layer is performed to provide the protective layer (step 108). In this example, the deposition phase (step 109) comprises providing a deposition gas and generating a plasma from the deposition gas to form a deposition layer. In this example, the deposition gas comprises a polymer forming recipe. An example of such a polymer forming recipe is a hydrocarbon gas such as, $C_2H_2$, $CH_4$ and $C_2H_4$, and a fluorocarbon gas, such as $CH_3F$, $CH_2F_2$, $CHF_3$, $C_4F_6$, and $C_4F_8$. Another example of a polymer forming recipe would be a fluorocarbon chemistry and a hydrogen containing gas, such as a recipe of $CF_4$ and $H_2$. The deposition gas is then stopped.

The profile shaping (step 110) comprises providing a profile shaping gas and generating a profile shaping plasma from the profile shaping gas to shape the profile of the deposition layer. The profile shaping gas is different from the deposition gas. As illustrated, the deposition phase (step 109) and the profile shaping phase (step 110) occur at different times. In this example the profile shaping gas comprises a fluorocarbon chemistry, such as $CF_4$, $CHF_3$, and $CH_2F_2$. Other gases such as COS $O_2$, $N_2$, and $H_2$ may be added. In this example, power is supplied at 0 watts at 2 MHz and 800 watts at 27 MHz. The profile shaping gas is then stopped.

In this example, the deposition phase (step 109) is repeated a second time. The same deposition recipe is used here as described above. In alternative embodiments, the deposition recipe can also be modified from the recipe in the first deposition phase.

The profile shaping phase (step 110) is repeated a second time. The same profile shaping recipe is used here as described above. The profile shaping recipe can also be modified from the recipe in the first deposition phase.

The protective layer formation process (step 108) can repeat for a number of cycles as until the desired protective layer is formed. Preferably, in this example, the number of cycles may be from 1 to 10 times. More preferably, the number of cycles is 2 to 3 times. Preferably, thickness of sidewalls of the protective layer are dependent on the ion implantation energies. Preferably the thicknesses of the sidewalls of the protective layer is between 5 nm to 30 nm. More preferably, sidewalls of the protective layer are 15 nm to 25 nm.

During or after the deposition of the protective layer, an optional ARL may be opened.

After the deposition of the protective layer (step 108) is completed, the dopant is implanted into the substrate with an ion implantation (step 112). An example of such an implantation would be boron, arsenic, or phosphorous implantation.

The protective layer and photoresist mask is then removed (step 116). Examples of a photoresist mask that could remove the protective layer and photoresist mask would be a chemical strip or a strip with a plasma formed from $O_2$ or $N_2/H_2$. Additional formation steps may also be performed (step 120).

Preferably, each deposition layer for each deposition phase is between 0.5 to 30 nm thick. More preferably, each deposition layer for each deposition phase is between 0.5 nm to 5 nm thick. Most preferably, each deposition layer for each deposition phase is between 1 to 5 nm thick. Preferably, the formation of the protective layer is performed for 1 to 10 cycles. More preferably, the formation of the protective layer is performed for 2 to 3 cycles.

One advantage of the inventive process is that a non-vertical deposition profile can be made more vertical by the subsequent anisotropic etch step for profile shaping. Another advantage of the inventive process is that deposition layers may be added and etch back resulting in a thin deposition layer formed during each cycle. Such a thin later can help to prevent delamination, which can be caused by forming a single thick layer. A single thick film may also cause other problems. In addition the cyclical process provides more control parameters, which allow for more tuning parameters, to provide a better conformal deposition layer. Since the cyclic process will keep the bread-loaf at a minimum throughout the CD reduction process, the CD gains at the bottom portion of the deposition profile can keep growing.

In one embodiment of the invention, the protective layer is of a carbon and hydrogen material.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for implanting a dopant in a substrate, comprising:
    forming a patterned photoresist mask over the substrate, wherein the patterned photoresist mask has patterned photoresist mask features;
    depositing a protective layer on the patterned photoresist mask by performing a cyclical deposition, wherein each cycle, comprises:
        a depositing phase for depositing a deposition layer over surfaces of the patterned mask of photoresist material; and
        a profile shaping phase for providing vertical sidewalls;
    implanting a dopant into the substrate using an ion beam; and
    removing the protective layer and photoresist mask;
    wherein the cyclical deposition of the protective layer is performed for at least two cycles; and
    wherein the profile shaping phase, comprises:
        flowing a profile shaping gas;
        forming the profile shaping gas into a plasma; and
        stopping the flow of the profile shaping gas.

2. The method, as recited in claim 1, wherein the protective layer and patterned photoresist mask are removed in a single stripping process.

3. The method, as recited in claim 2, wherein the protective layer has sidewalls with a thickness between 5 nm to 30 nm.

4. The method, as recited in claim 3, wherein the depositing the protective layer does not form a protective layer across bottoms of the patterned mask features.

5. The method, as recited in claim 4, wherein the depositing the protective layer forms the protective layer on top of the patterned photoresist mask.

6. The method, as recited in claim 5 wherein the photoresist mask is of an ion implantation photoresist material.

7. The method, as recited in claim 6, wherein the profile shaping phase, comprises:
    flowing a profile shaping gas;
    forming the profile shaping gas into a plasma; and
    stopping the flow of the profile shaping gas.

8. The method, as recited in claim 7, wherein the removing the protective layer and photoresist mask is a chemical stripping.

9. The method, as recited in claim 1, wherein the protective layer and patterned photoresist mask are removed in a single stripping process.

10. The method, as recited in claim 1, wherein the protective layer has sidewalls with a thickness between 5 nm to 30 nm.

11. The method, as recited in claim 1, wherein the depositing the protective layer does not form a protective layer across bottoms of the patterned mask features.

12. The method, as recited in claim 1, wherein the depositing the protective layer forms the protective layer on top of the patterned photoresist mask.

13. The method, as recited in claim 1 wherein the photoresist mask is of an ion implantation photoresist material.

14. The method, as recited in claim 1, wherein the profile shaping phase, comprises:
 flowing a profile shaping gas;
 forming the profile shaping gas into a plasma; and
 stopping the flow of the profile shaping gas.

15. The method, as recited in claim 1, wherein the removing the protective layer and photoresist mask is a chemical stripping.

* * * * *